United States Patent
Konter et al.

[11] Patent Number: 5,888,451
[45] Date of Patent: Mar. 30, 1999

[54] NICKEL-BASE SUPERALLOY

[75] Inventors: Maxim Konter, Untersiggenthal; Michael Newnham, Baden; Christoph Tönnes, Klingnau, all of Switzerland

[73] Assignee: ABB Research Ltd., Zurich, Switzerland

[21] Appl. No.: 738,106

[22] Filed: Oct. 25, 1996

[30] Foreign Application Priority Data

Jun. 17, 1996 [DE] Germany .................... 196 24 055.7

[51] Int. Cl.[6] .................................................. C22C 19/05
[52] U.S. Cl. ...................... 420/448; 148/404; 148/410; 148/428
[58] Field of Search ........................... 420/448; 148/410, 148/428, 404

[56] References Cited

U.S. PATENT DOCUMENTS

| | | |
|---|---|---|
| 5,100,484 | 3/1992 | Wukusick et al. . |
| 5,470,371 | 11/1995 | Darolia . |
| 5,549,765 | 8/1996 | Mihalisin et al. ............ 148/428 |

FOREIGN PATENT DOCUMENTS

| | | |
|---|---|---|
| 0155827A2 | 9/1985 | European Pat. Off. . |
| 0208645A2 | 1/1987 | European Pat. Off. . |
| 0240451A3 | 10/1987 | European Pat. Off. . |
| 2235697 | 3/1991 | United Kingdom . |
| WO93/24683 | 12/1993 | WIPO . |

OTHER PUBLICATIONS

"Development of Two Rhenium–Containing Superalloys for Single–Crystal Blade and Directionally Solidified Vane Applications in Advanced Turbine Engines", K. Harris, et al., Journal of Materials Engineering and Performance, Aug. 1993, No. 4, pp. 481–487.

*Primary Examiner*—Margery Phipps
*Attorney, Agent, or Firm*—Burns, Doane, Swecker & Mathis, L.L.P.

[57] ABSTRACT

A nickel-base superalloy, in particular for the fabrication of monocrystalline components, consisting essentially of (measured in wt %) 6.0–6.8% of Cr, 8.0–10.0% of Co, 0.5–0.7% of Mo, 6.2–6.6% of W, 2.7–3.2% of Re, 5.4–5.8% of Al, 0.5–0.9% of Ti, 7.2–7.8% of Ta, 0.15–0.3% of Hf. 0.02–0.04% of C, 40–100 ppM of B, the remainder being nickel with impurities. The ratio (Ta+1.5 Hf+0.5 Mo–0.5 Ti)/(W+1.2 Re) is greater than or equal to 0.7.

19 Claims, 1 Drawing Sheet

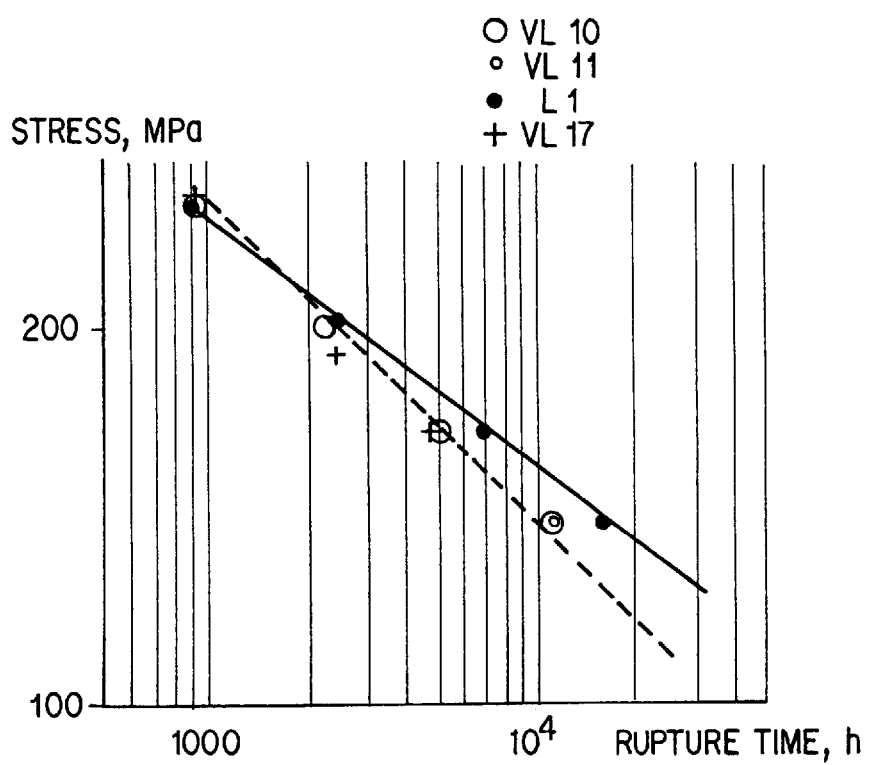

NICKEL-BASE SUPERALLOY

BACKGROUND OF THE INVENTION

1. Field of the Invention

The invention relates to a nickel-base superalloy, in particular for the fabrication of monocrystalline components.

2. Discussion of Background

Nickel-base superalloys of this type are known. These alloys are used to fabricate monocrystalline components, in particular turbine blades of gas turbines. By means of these monocrystalline components, the mechanical strength of the material at high temperatures can be maximized. As a result, the inlet temperature of gas turbines can be increased, with a consequent rise in the efficiency of the gas turbine.

Monocrystalline alloys as disclosed by U.S. Pat. No. 4,643,782, Swiss Patent No. 637 165, EP 0 076 360, U.S. Pat. No. 5,270,123 and EP 0 208 645 to this end include solid solution strengthening elements such as Re, W, Mo, Co, Cr, as well as elements forming γ' phases such as Al, Ta and Ti. The percentage of refractory alloy elements in the base matrix Ni increases continually with the increase of the operating temperature required for the alloys. Customarily, a monocrystalline alloy contains (in wt %): 6–8% of W, up to 6% of Re and up to 2% of Mo. The alloys described in the abovementioned publications exhibit high creep resistance, good LCF (low cycle fatigue) and HCF (high cycle fatigue) characteristics, as well as high oxidation resistance.

These known alloys were developed for aircraft turbines and therefore optimized with respect to short-term and medium-term characteristics, i.e. the service life is designed to be up to 20,000 hours. In contrast, industrial gas turbine components have to be designed for a service life of up to 75,000 hours. By virtue of the optimization in terms of maximum creep strength at high temperatures and high stresses, these alloys have a positive heat treatment window i.e. the primary γ' phase is completely dissolved without incipient melting of the alloy.

Thus, an alloy "CMSX-4" from U.S. Pat. No. 4,643,782, when used in industrial gas turbines, does indeed exhibit good creep resistance, but has a high susceptibility to the formation of small-angle grain boundaries, of freckles, i.e. imperfections due to a chain of equidirectional grains having a high eutectic content, and also to extensive recrystallization of the monocrystalline components during solutionizing After an operating time of 3000 hours at temperatures above 1000° C., the alloy shows marked coarsening of the γ' structure, followed by an increase in the creep rate.

Swiss Patent No. 637 165, EP 0 208 645 and "Second generation nickel-base superalloy", A. D. Cetel et al., Superalloys 1988, ed S. Reichman et al., Met. Soc., 1988, p. 235, disclose alloys designated as "PWA", in particular "PWA 1484", and EP 0 076 360 and U.S. Pat. No. 5,270,123 disclose alloys designated as "Ren", in particular "René N5", but these have drawbacks similar to those of the alloy CMSX-4.

By means of the alloying elements chosen, a positive or negative lattice offset between γ phase and γ', phase is generated in the abovementioned alloys. As a result of the lattice distortion, γ' grains impede slippage or intersection of dislocations. While said lattice distortion does bring about an increase in the low-cycle fatigue strength, it also causes, with prolonged loading, coarsening of the microstructure and, correspondingly, a long-term mechanical weakening of the alloy.

SUMMARY OF THE INVENTION

Accordingly. one object of the invention is to improve, for a nickel-base superalloy of the type mentioned at the outset, the long-term behavior at high operating temperatures and to achieve a high yield of components fabricated by means of said alloy.

The invention provides a nickel-base superalloy which consists essentially of (measured in wt %) : 6.0–6.8% Cr, 8.0–10.0% Co, 0.5–0.7% Mo, 6.2–6.6% W, 2.7–3.2% Re, 5.4–5.8% Al, 0.5–0.9% Ti, 7.2–7.8% Ta, 0.15–0.3% Hf, 0.02–0.04% C, 40–100 ppm B, 0–400 ppm Y, the remainder being nickel with impurities, wherein the ratio $(Ta+1.5 Hf+0.5 Mo-0.5 Ti)/(W+1.2 Re) \geq 0.7$.

To be counted among the advantages of the invention is the fact that the alloy has perfect castability and high phase stability in combination with excellent mechanical characteristics. It is distinguished, moreover, by high fatigue resistance and creep resistance even under long-term loading conditions.

The alloys according to the invention do not have, at operating temperature, any lattice offset between γ phase and γ' phase, thus achieving high long-term stability at moderate loads.

The alloy is distinguished by a slight tendency to recrystallize during heat treatments and by a slight tendency to form freckles. The formation of freckles is achieved by a balanced chemical composition, by means of which density differences of the liquid metal in the slushy zone and above the solidification front are avoided.

The alloy according to the invention is distinguished by a negative heat treatment window, which makes it possible to use elements which lower the melting point, such as B and Hf, which are advantageous with respect to the yield for the fabrication of monocrystalline components. Moreover, the percentage of γ' phase-stabilizing elements and above all of Ta can be tailored in terms of the long-term stability of the structure and the properties of the alloy at high temperatures and moderate stresses.

BRIEF DESCRIPTION OF THE DRAWING

A more complete appreciation of the invention and many of the attendant advantages thereof will be readily obtained as the same becomes better understood by reference to the following detailed description when considered in connection with the accompanying single drawing, wherein the rupture time is plotted against the applied stress for an alloy according to the invention, compared with known alloys.

DESCRIPTION OF THE PREFERRED EMBODIMENTS

The alloy according to the invention which is used for the fabrication of monocrystalline components or directionally solidified components for industrial gas turbines essentially comprises (in wt %)

Cr 6.0–6.8
Co 8.0–10.0
Mo 0.5–0.7
W 6.2–6.6
Re 2.7–3–2
Al 5.4–5.8
Ti 0.5–0.9
Ta 7.2–7.8
Hf 0.15–0.3
C 0.02–0.04
B 40–100 ppm Ni remainder
and unavoidable impurities.

This nickel-base superalloy is distinguished by a unique combination of castability of large monocrystalline components, increased long-term stability of the alloy structure and high mechanical characteristics at moderate loads at temperatures of from 850° to 1050° C.

In Table 1, alloys according to the invention L1, L2, L3 and L4 are juxtaposed with comparative alloys VL10 to VL19, whose chemical composition is outside the composition according to the invention, the comparative alloys VL17, VL18 and VL19 being commercially used alloys with the trademarks CMSX-4, René N5 and PWA1484, in accordance with what was stated at the outset.

The alloys L1 to L4 and VL10 to VL16 have a negative heat treatment window and were therefore solutionized after casting in a multiple cycle. The maximum solutionizing temperature in this process was 1310° C., i.e. 10° to 15° C. below the γ' Solvus (solubility curve for the solid phase in the state diagram) temperature. In the case of alloy VL17, 99.5% of the γ' phase dissolved. All alloys were then precipitation-hardened at 1140°–1150° C. for 4 hours and at 870° C. for 20 hours.

After a homogenization anneal, nickel-base superalloys usually have a lattice offset (ay'-ay) between γ lattice (ay) and γ' lattice (ay'). Table 2 illustrates the offsets of different alloys. VL10 and VL19 have a positive offset, VL11, VL17 and VL18 have a negative offset. A positive or negative offset results in an additional stress field around the γ' grains and thus increases the resistance to intersection or climbing of dislocations during creep. This is important for components used at high loads and high temperatures. The long-term result, however, of the lattice offset at high temperatures and moderate or low load is grain coarsening, followed by degradation of the γ' structure. This leads to a reduction in the creep characteristics when such components are used for more than 20,000 hours of service.

The alloys L1 to L4 having a γ/γ' structure without a lattice offset have a lower mechanical strength, in the short-term view, than the comparative alloys VL containing a lattice offset. In long-term operation at high temperatures, however, the alloys L1 to L4 have a far higher stability The lattice offset of the γ/γ' structure is compensated for, according to the invention, by tantalum which has a partition coefficient in the γ/γ' structure of 0.22. Ta is thus a strong γ' former. The Ta atoms replace the Al atoms in the γ' lattice and modify the lattice parameter of the γ' lattice owing to the large atomic radius of the Ta atoms. According to Table 2, alloys with a tantalum content of less than 7% have a negative lattice offset, those with a Ta content of from 7 to 8% do not have a lattice offset, and those with a Ta content of more than 8% have a positive lattice offset.

The influence of the lattice offset on the long-term creep behavior is illustrated in Table 3. The comparative alloys VL10, VL11 and VL17 have a better short-term creep behavior, compared with the alloys L1, L3 and L4. At moderate loads, however, the long-term characteristics of the alloys L1, L3 and L4 are significantly higher.

In the only figure, the rupture time is plotted against the applied stress at 950° C. in each case. It can be seen from the figure that the alloy L1 according to the invention is able to sustain a higher stress, at prolonged loading, than the comparative alloys which have a positive (VL10) or a negative (VL11, VL17) lattice offset.

The composition of the alloy elements in the present invention is restricted by precipitates of refractory, Re—Cr—rich TCP phases. These phases are formed if the percentage of Cr, Mo, W, Re or of γ'-forming elements is higher than specified according to the invention. Thus, the comparative alloy VL15 forms acicular, Re—Cr—rich precipitates after aging at 1000° C. for 1000 h. These precipitates result in impairment of the mechanical properties, especially of the LCF characteristics (Table 3) of the comparative alloy. On the other hand, those comparative alloys whose percentage of Cr, Mo, W, Re or of γ'-forming elements is lower than specified according to the invention have poor creep resistance owing to the low percentage of γ' phase and a relatively weak γ matrix, such as for example VL16 according to Table 3.

The formation of freckles, i.e. imperfections due to a chain of equidirectional grains having a high eutectic content, is a normal imperfection in large monocrystalline castings. Freckle formation can be ascribed to the interdendritic liquid flowing during solidification. The flow is driven by unstable density distributions, if the interdendritic liquid is lighter than the liquid having the nominal composition. For the fabrication of relatively large monocrystalline castings it is therefore important to equalize the chemical composition of the alloy so that the density difference between liquid metal in the slushy zone and above the solidification zone becomes negligible. Elements such as Ta, Mo and Hf segregate in the slushy zone, during solidification, into the interdendritic liquid and increase the density of the latter. In contrast, the Ti, which likewise segregates into the interdendritic liquid, lowers the density. Heavy elements such as W and Re strongly segregate into the dendrites, as a result of which the interdendritic liquid in W/Re-rich alloys has a strong tendency to be lighter than the liquid having a nominal composition Ideally, the interdendritic liquid should be heavier than the liquid above the solidification zone. As a result, no liquid will flow against the solidification zone, i.e. no flow is produced and consequently no freckles form. This condition can be described empirically by a "no-freckles parameter" NFP:

$$NFP = (Ta + 1.5Hf + 0.5Mo - 0.5Ti)/(W + 1.2Re) \leq 1, \quad \{1\}$$

The coefficients reflect the segregation quotient and the atomic weight of each element, In a real system, however, additional factors and process parameters play a part in the formation or inhibition of freckles.

The critical condition of the liquid metal for forming freckle chains can be described by the Stokes equation and a dependence of the growth rate from "The origin of freckles in unidirectionally solidified casting", S. M. Copley et al., Met. Trans., August 1970, p. 2193:

$$1_{crit} = W^* \tau = (2/9)^* (\Delta \rho / \mu r)^* (\Delta T / (G_S^* V_S))[cm] \quad \{2\}$$

where:

$\Delta \rho = \rho$ (liquid above slushy zone)-$\rho$ (interdendritic liquid) [kg/m$^3$]

$\mu$: viscosity of the liquid metal r: diameter of the transport duct $$r \approx A^* DAS = A^* K/(G_L^{0.5} * V_L^{0.25}), \quad \{3\}$$

$A \approx 0.3$, K is a material constant $G_L$: temperature gradient at the liquid front $V_L$: velocity of the liquid front $\Delta T$: solidification range $G_S$: temperature gradient in the slushy zone $V_S$: solidification rate To separate the effect of the process parameters on the formation of freckles from the effect of the alloy composition, formula {2} can be rewritten with the aid of formula {3}, on the assumption that the viscosity of the liquid metal depends much more strongly on the temperature than on the change in the alloy elements.

$$1_{crit}=(2/9A)*(G_L^{0.5}*V_L^{0.25}/(\mu*G_S*V_S))*(\underline{\Delta\rho*\Delta T/K}) \quad \{4\}$$

The underlined section of formula {4} represents the effect due to alloy composition.

In addition to $\Delta\rho$, whose magnitude can be estimated using formula {1}, the material constant K plays an important part in connection with the torqueosity of the interdendritic channels in the slushy zone. Script-like carbides of type (Hf, Ta)C in the interdendritic domains cause a considerable increase in the constant K. In contrast, the solidification range $\Delta T$, calculated as the difference between the starting point and the end point of solidification in the DTA (differential thermal analysis) cooling curve, is approximately equal for all progressive monocrystalline alloys or unidirectionally solidified alloys, irrespective of the alloy elements, as can be seen from Table 4, column $\Delta Tc$.

The alloys L1, L2, VL12, VL13 and VL17 were used to cast blades with a length of 270 mm and a solid base. The casting parameters were kept identical for all the experiments; the withdrawal rate was 4 mm/min for the blade itself and 2.5 mm/min for the blade base, to obtain a monocrystalline blade. These casting conditions are typical for the industrial production of solid monocrystalline blades. After casting the blades were heat-treated. The blades made from the alloys L1, L2, VL12 and VL13 were solutionized at 1310° C., the blade made from the alloy VL17 was solutionized to 99.5%, and all the blades were tested. The blades made from the alloys L1, L2. VL12 and VL13 did not exhibit recrystallization, whereas the blade made from the alloy VL17 exhibited recrystallization of the monocrystalline structure According to Table 4, alloys hating an NFP <0.70 show a tendency to form freckles. This is also the case with alloys having an NFP $\geq 0.70$ with a carbon content below 200 ppm and a. hafnium content below 0.15 wt %, for example in the case of VL12.

Variations in the solidification range $\Delta T$ are insignificant. The alloys VL19 and VL20 (MM-247 DS, solidified unidirectionally) were not cast, but by their different chemical composition (VL20: rich in C, B, Hf, no Re; VL19: high Mo content, no Ti) they illustrate the thesis that the solidification range is approximately identical for different high-alloy superalloys.

It follows from the experiments that under customary casting conditions for solid components of gas turbines a freckle-free alloy must meet the following conditions (for the case where the NFP does not exceed 1, corresponding to formula {1}):

$$NFP=(Ta+1.5Hf+0.5Mo-0.5Ti)/(W+1.2Re)0.7 \quad \{5\}$$

and $C \geq 200$ ppm; Hf 0.15 wt %.

On the other hand, the desired percentage of Hf and $C \leq$ in the monocrystalline alloy is limited to C 400 ppm and $Hf \leq 0.3\%$, owing to the detrimental effect of script-like (Hf, Ta, Ti)C carbides and incipient melting of Hf-rich eutectic on the LCF characteristics. Analyses by means of the scanning electron microscope of LCF samples have shown that script-like carbides and incipient melting porosity are the main reason for the low LCF service life of the comparative alloy VL14 in comparison with the alloys L1, L3 and L4 in Table 3.

The element boron, which lowers the melting point, is alloyed in a percentage of from 40 to 100 ppm. If the B percentage is inadequate, detrimental, coarse carbides are precipitated. This results in poor LCF characteristics. If the B percentage is increased unduly, eutectics with a low melting point are formed. This likewise results in poor LCF characteristics.

Further elements which can be alloyed are magnesium and yttrium. When Mg is alloyed in small amounts, from about 10 to 20% of the C content, i.e. from 15 to 50 ppm of Mg, this results, in combination with B and Hf, in fine, island-like carbides in the alloys according to the invention. The distribution of the carbides in the alloy volume is concentrated inhomogeneously at the small-angle grain boundaries. The Mg, which segregates strongly towards the grain boundaries, affects the segregation of the carbide-forming elements Hf, Ta and Ti, and the Mg interacts with these elements. The large atomic radius of Mg causes a marked lattice distortion at the small-angle grain boundaries, which facilitates the segregation of C into the small-angle grain boundaries. The fine, dense carboboride structure resulting therefrom along the grain boundaries improves the transverse characteristics and at the same time the fatigue strength of the monocrystalline components. If the Mg content exceeds 50 ppm, the transverse mechanical characteristics decrease markedly. This can be ascribed to the formation of large-scale carbides and Ni-Mg compounds along the grain boundaries. Yttrium improves the oxidation resistance and corrosion resistance at percentages up to 400 ppm, particularly at percentages of from 10 to 400 ppm. Higher Y percentages cause a drop in the ductility. Y-doped alloys, however, require a special casting technique to prevent any reaction between casting mold and metal.

The alloys according to the invention are eminently suitable for treatment by a heat treatment process comprising the following steps: annealing at from 850° C. to 1100° C., in particular at from 930° C. to 970° C. for from 1 to 4 hours and at from 1030° C. to 1070° C. for from 2 to 20 hours, heating to 1200° C., heating to a temperature of 1200° C.<T 1300° C. at a heating rate less than or equal to 1° C./min, in particular at a heating rate of approximately 0.5° C./min, a multistage homogenization and dissolution process at a temperature of 1300° C.$\leq T \leq$1315° C., in particular at approximately 1300° C. for approximately 2 hours and then at approximately 1310° C. for from 6 to 12 hours.

To be counted among the advantages of the heat treatment is the fact that the process closes off dislocation sources and thus prevents the generation of further dislocations. Furthermore, recrystallization during the heating process is avoided and the annihilation of the dislocation network is promoted. The multi-stage homogenization and dissolution process gives rise to very good homogenization of the bodies made from the material. The remaining eutectic of from 1 to 4 vol-% is sufficient to pin the grain boundaries of recrystallization grains.

Obviously, numerous modifications and variations of the present invention are possible in light of the above teachings. components made from this alloy can also be incorporated into other machines, where a stable structure and high mechanical characteristics are required in long-term operation at high temperatures. It is therefore to be understood that within the scope of the appended claims, the invention may be practiced otherwise than as specifically described herein.

| Elemental Content wt % Alloy | Cr | Co | Mo | W | Re | Al | Ti | Ta | Hf | C, ppm | B, ppm |
|---|---|---|---|---|---|---|---|---|---|---|---|
| L1 | 6.5 | 9.5 | 0.6 | 6.4 | 3 | 5.6 | 0.6 | 7.5 | 0.2 | 250 | 55 |
| L2 | 6.5 | 9.5 | 0.6 | 6.6 | 3.2 | 5.6 | 0.9 | 7.2 | 0.15 | 250 | 50 |
| L3 | 6.8 | 10 | 0.7 | 6.6 | 3.2 | 5.8 | 0.9 | 7.8 | 0.25 | 300 | 65 |
| L4 | 6.1 | 8 | 0.5 | 6.2 | 2.7 | 5.5 | 0.5 | 7.2 | 0.15 | 220 | 45 |
| VL10 | 6.5 | 9.5 | 0.6 | 6.5 | 3 | 5.6 | 0.6 | 8.2 | 0.2 | 250 | 50 |
| VL11 | 6.5 | 9.5 | 0.6 | 6.5 | 3 | 5.7 | 0.6 | 6.7 | 0.2 | 250 | 50 |
| VL12 | 6.5 | 9.5 | 0.6 | 6.5 | 3 | 5.6 | 0.6 | 7.2 | 0.10 | 100 | 50 |
| VL13 | 6.5 | 9.5 | 0.6 | 6.6 | 3.2 | 5.6 | 0.9 | 6.7 | 0.15 | 250 | 50 |
| VL14 | 6.5 | 9.5 | 0.6 | 6.5 | 3 | 5.6 | 0.6 | 7.5 | 0.35 | 500 | 55 |
| VL15 | 7.0 | 10 | 0.7 | 6.6 | 3.2 | 6.0 | 1.0 | 7.8 | 0.25 | 300 | 65 |
| VL16 | 5.8 | 7.8 | 0.5 | 6 | 2.5 | 5.3 | 0.4 | 7 | 0.15 | 220 | 45 |
| VL17 (CMSX-4) | 6.4 | 9.7 | 0.6 | 6.4 | 2.9 | 5.65 | 1.0 | 6.5 | 0.1 | 30 | — |
| VL18 (René N5) | 7 | 7.5 | 1.5 | 5 | 3 | 6.2 | — | 6.5 | 0.15 | 500 | 40 |
| VL19 (PWA1484) | 5 | 10 | 2 | 6 | 3 | 5.6 | — | 8.7 | 0.1 | — | — |

Table 1: Chemical composition of the alloys, the remainder being nickel in each case (L1–L4 and VL10–VL16 additionally contain 20–25 ppm of Mg)

| Alloy | Ta, wt % | $a\gamma$, Å | $a\gamma'$, Å | Lattice offset $a\gamma'-a\gamma$, Å |
|---|---|---|---|---|
| L1 | 7.5 | 3.588 | 3.588 | 0 |
| L3 | 7.8 | 3.590 | 3.590 | 0 |
| L4 | 7.2 | 3.587 | 3.587 | 0 |
| VL10 | 8.2 | 3.587 | 3.591 | 0.004 |
| VL11 | 6.7 | 3.588 | 3.586 | −0.002 |
| VL17 (CMSX-4) | 6.5 | 3.590 | 3.586 | −0.004 |
| VL18 (René N5) | 6.5 | 3.586 | 3.583 | −0.003 |
| VL19 (PWA 1484) | 8.7 | 3.584 | 3.590 | 0.006 |

Table 2: Lattice parameters

| | Rupture time; h at 950° C. and respectively: | | | | $N_f$ at 1000° C., cycles (after ageing 1000° C./10000 h) |
|---|---|---|---|---|---|
| Alloy | 250 MPa | 200 MPa | 165 MPa | 140 MPa | $\Delta E_{tot} = 0.9\%$ |
| L1 | 880 | 2388 | 6815 | >15000 | 4214 |
| L3 | 895 | 2467 | 6910 | — | 4337 |
| L4 | 847 | 2138 | 6050 | — | 3896 |
| VL10 | 947 | 2280 | 5040 | 11700 | — |
| VL11 | 918 | 2203 | 5180 | 12614 | — |
| VL14 | — | — | — | — | 2215 |
| VL15 | — | 2250 | 4430 | — | 1540 |
| VL16 | — | 1990 | 3690 | — | — |
| VL17 (CMSX-4) | 1018 | 2438 (at 190 MPa) | 4760 | — | 3365 |

Table 3: Creep rupture strength and LCF characteristics

| Cast blades made from alloy | NFP | C, ppm | Hf, wt-% | Content of script-like carbides vol. % | $\Delta Tc$, K | Freckle chains in the blade base |
|---|---|---|---|---|---|---|
| L1 | 0.78 | 250 | 0.20 | 0.4 | 96 | none |
| L2 | 0.70 | 250 | 0.15 | 0.4 | 96 | none |
| VL12 | 0.73 | 100 | 0.10 | — | 94 | 11 |
| VL13 | 0.65 | 250 | 0.15 | 0.4 | 96 | 8 |
| VL17 | 0.65 | 30 | 0.10 | — | 93 | >30 |
| (CMSX-4) Reference specimens: | | | | | | |
| VL19 (PWA-1484) | 1.05 | — | 0.10 | — | 88 | freckle-free |
| VL20 (MM-247 DS) | 0.51 | 1.3 | 1.3 | >2 | 103 | freckle-prone |

Table 4: Freckle-proneness parameters and results from cast specimens

What is claimed as new and desired to be secured by Letters Patent of the United States:

1. A nickel-base superalloy useful for the fabrication of monocrystalline components, consisting essentially of in wt %: 6.0–6.8% Cr, 8.0–10.0% Co, 0.5–0.7% Mo, 6.2–6.6% W, 2.7–3.2% Re, 5.4–5.8% Al, 0.5–0.9% Ti, 7.2–7.8% Ta, 0.15–0.3% Hf, 0.02–0.04% C, 40–100 ppm B, 0–400 Y, the remainder being nickel with impurities wherein the ratio (Ta+1.5 Hf+0.5 Mo−0.5 Ti)/(W+1.2 Re)≧0.7, said superalloy having gamma and gamma prime phases and an insubstantial lattice offset between the gamma and gamma prime phases.

2. The nickel-base superalloy of claim 1, wherein the superalloy consists essentially of 6.4–6.6% Cr, 9.4–9.6% Co, 0.6% Mo, 6.4–6.6% W, 3.0–3.2% Re, 5.6% Al, 0.6–0.9% Ti, 7.2–7.5% Ta, 0.15–0.2% Hf, 0.02–0.03% C, 50–60 ppm B, the remainder being nickel with impurities.

3. The nickel-base superalloy of claim 1, wherein 15–50 ppm Mg and/or 10–400 ppm Y are present.

4. The nickel-base superalloy of claim 1, having a negative heat treatment window.

5. The nickel-base superalloy of claim 1, having an insubstantial difference in density between interdendritic liquid and nominal liquid composition during solidification of the superalloy.

6. The nickel-base superalloy of claim 1, having a microstructure which does not recrystallize to a significant extent during heat treatment at 1310° C.

7. The nickel-base superalloy of claim 1, having (Ta+1.5 Hf+0.5 Mo−0.5 Ti)/(W+1.2 Re)≦1.0.

8. The nickel-base superalloy of claim 1, having improved low cycle fatigue properties due to absence of incipient melting phases and/or script-like carbides.

9. The nickel-base superalloy of claim 1, having B in an amount which avoids precipitation of coarse carbides and/or formation of low melting point eutectic.

10. The nickel-base superalloy of claim 1, having Mg in an amount effective to form carboborides along low angle grain boundaries.

11. The nickel-base superalloy of claim 1, having been cast and heat treated to provide 1 to 4 volume % eutectic pinning grain boundaries of recrystallized grains.

12. A nickel-base superalloy monocrystalline component, consisting essentially of: 6.0–6.8% Cr, 8.0–10.0% Co, 0.5–0.7% Mo, 6.2–6.6% W, 2.7–3.2% Re, 5.4–5.8% Al, 0.5–0.9% Ti, 7.2–7.8% Ta, 0.15–0.3% Hf, 0.02–0.04% C, 40–100 ppm B, 0–400 ppm Y, the being nickel with impurities wherein the ratio (Ta+1.5 Hf+0.5 Mo−0.5 Ti)/(W+1.2 Re)≧0.7.

13. The nickel-base superalloy monocrystalline component of claim 12, wherein the superalloy comprises: 6.4–6.6% Cr, 9.4–9.6% Co, 0.6% Mo, 6.4–6.6% W, 3.0–3.2% Re, 5.6% Al, 0.6–0.9% Ti, 7.2–7.5% Ta, 0.15–0.2% Hf, 0.02–0.03% C, 50–60 ppm B, the remainder being nickel with impurities.

14. The nickel-base superalloy monocrystalline component of claim 12, wherein 15–50 ppm Mg and/or 10–400 ppm Y are present.

15. The nickel-base superalloy monocrystalline component of claim 12, wherein the monocrystalline component is a blade of a gas turbine.

16. The nickel-base superalloy monocrystalline component of claim 12, having gamma and gamma prime phases and an insubstantial lattice offset between the gamma and gamma prime phases.

17. The nickel-base superalloy monocrystalline component of claim 12, having a negative heat treatment window.

18. The nickel-base superalloy monocrystalline component of claim 12, having an insubstantial difference in density between interdendritic liquid and nominal liquid composition during solidification of the superalloy.

19. The nickel-base superalloy monocrystalline component of claim 12, having (Ta+1.5 Hf+0.5 Mo−0.5 Ti)/(W+1.2 Re)≦1.0.

* * * * *